(12) United States Patent  
Gotoda et al.

(10) Patent No.: US 9,209,362 B2  
(45) Date of Patent: *Dec. 8, 2015

(54) SEMICONDUCTOR LIGHT EMITTING DEVICE AND METHOD OF FABRICATING SEMICONDUCTOR LIGHT EMITTING DEVICE

(71) Applicant: KABUSHIKI KAISHA TOSHIBA, Minato-ku (JP)

(72) Inventors: Toru Gotoda, Yokohama (JP); Toshiyuki Oka, Yokohama (JP); Shinya Nunoue, Ichikawa (JP); Kotaro Zaima, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/284,501

(22) Filed: May 22, 2014

(65) Prior Publication Data

US 2014/0284647 A1 Sep. 25, 2014

Related U.S. Application Data

(60) Continuation of application No. 13/689,841, filed on Nov. 30, 2012, now Pat. No. 8,766,305, which is a division of application No. 12/874,625, filed on Sep. 2, 2010, now Pat. No. 8,334,153.

(30) Foreign Application Priority Data

Mar. 9, 2010 (JP) .................................. 2010-052220

(51) Int. Cl.
*H01L 33/00* (2010.01)
*H01L 33/40* (2010.01)
(Continued)

(52) U.S. Cl.
CPC .............. *H01L 33/405* (2013.01); *H01L 33/20* (2013.01); *H01L 33/32* (2013.01); *H01L 33/40* (2013.01);
(Continued)

(58) Field of Classification Search
CPC ....... H01L 33/62; H01L 33/641; H01L 33/642; H01L 33/22; H01L 33/38
USPC ................................ 257/98, 99, 103, E33.062
See application file for complete search history.

(56) References Cited

U.S. PATENT DOCUMENTS 5,523,591 A 6/1996 Fleming et al.  
6,900,473 B2 5/2005 Yoshitake et al.  
(Continued)

FOREIGN PATENT DOCUMENTS

JP 10-32189 2/1998  
JP 2007-134415 5/2007  
(Continued)

OTHER PUBLICATIONS

Japanese Office Action issued Feb. 17, 2012 in patent application No. 2010-052220 (with English translation).

(Continued)

*Primary Examiner* — Tan N Tran  
(74) *Attorney, Agent, or Firm* — Oblon, McClelland, Maier & Neustadt, L.L.P.

(57) ABSTRACT

A semiconductor light emitting device has a light emitting element, a first electrode layer, a second electrode layer, a seed electrode layer and a plated layer. The light emitting element has a nitride-based III-V compound semiconductor on a substrate. The light emitting element having a light extraction surface. The first electrode layer on the light extraction surface. The second electrode layer is provided on a surface opposite to the light extraction surface of the light emitting element. The seed electrode layer is configured to cover the entire surface of the second electrode layer. The plated layer is provided on the seed electrode layer. The light emitting element has a light emitting layer, a first conductive type semiconductor layer, and a second conductive type semiconductor layer. The light emitting element has a forward tapered shape of a width which gradually narrows in order of the second conductive type semiconductor layer, the light emitting layer and the first conductive type semiconductor layer.

5 Claims, 3 Drawing Sheets

(51) Int. Cl.
  *H01L 33/20* (2010.01)
  *H01L 33/32* (2010.01)
  *H01L 33/44* (2010.01)
  *H01L 33/62* (2010.01)

(52) U.S. Cl.
  CPC ............. *H01L 33/44* (2013.01); *H01L 33/62* (2013.01); *H01L 33/0079* (2013.01); *H01L 2924/0002* (2013.01)

(56) References Cited

U.S. PATENT DOCUMENTS

| | | | |
|---|---|---|---|
| 7,989,834 B2 | 8/2011 | Park | |
| 8,436,383 B2 * | 5/2013 | Jung | 257/98 |
| 8,766,305 B2 * | 7/2014 | Gotoda et al. | 257/98 |
| 2007/0298587 A1 | 12/2007 | Park et al. | |
| 2010/0203661 A1 | 8/2010 | Hodota | |

FOREIGN PATENT DOCUMENTS

| | | |
|---|---|---|
| JP | 2007-173465 | 7/2007 |
| JP | 2007-294579 | 11/2007 |
| JP | 2007-299935 | 11/2007 |
| JP | 2009-283762 | 12/2009 |
| JP | 2010-27643 | 2/2010 |

OTHER PUBLICATIONS

Japanese Office Action issued May 11, 2012, in Japanese Patent Application No. 2010-052220 (with English translation).
Office Action (with English translation) mailed on Sep. 7, 2012, in counterpart Japanese Application No. 2010-052220 (4 pages).

* cited by examiner

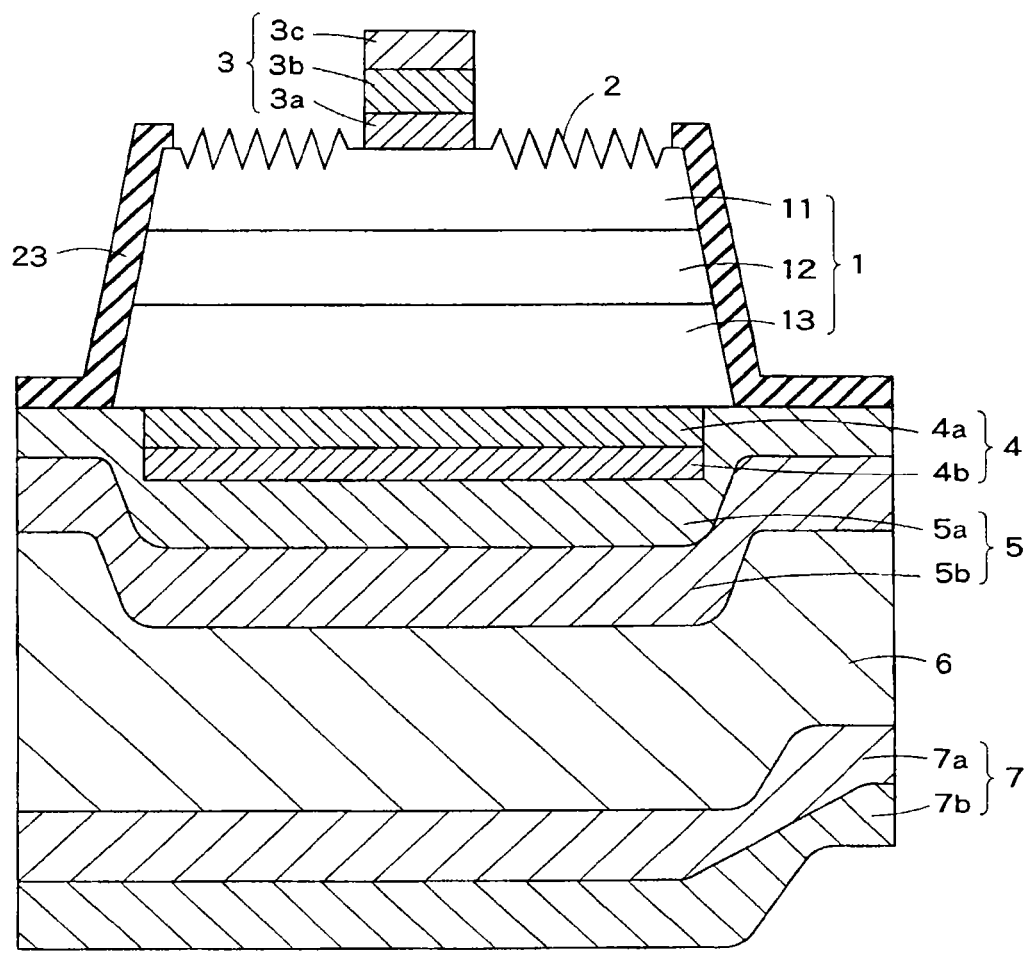
F I G. 1

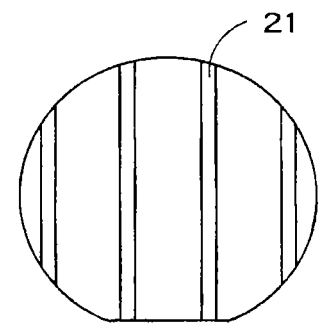
F I G. 4
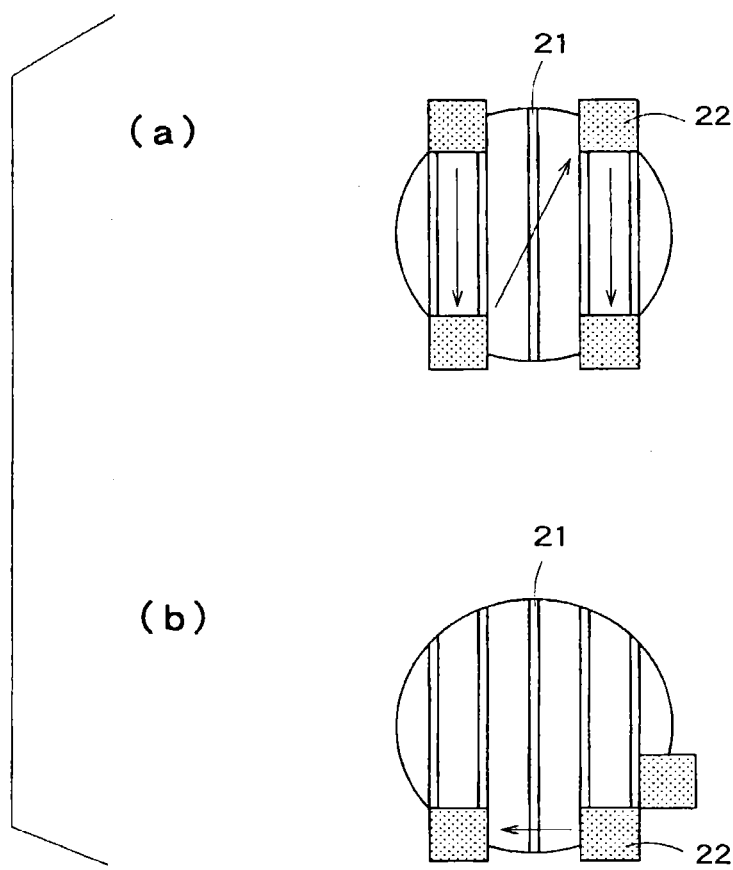
F I G. 5

SEMICONDUCTOR LIGHT EMITTING DEVICE AND METHOD OF FABRICATING SEMICONDUCTOR LIGHT EMITTING DEVICE

CROSS REFERENCE TO RELATED APPLICATIONS

This application is a continuation of and claims the benefit of priority under 35 U.S.C. §120 from U.S. Ser. No. 13/689,841, filed Nov. 30, 2012, which is a division of Ser. No. 12/874,625, filed Sep. 2, 2010, now U.S. Pat. No. 8,334,153, and claims the benefit of priority from the prior Japanese Patent Application No. 2010-52220, filed on Mar. 9, 2010, the entire contents of each of which are incorporated herein by reference.

FIELD

An embodiment relates to a semiconductor light emitting device using a nitride-based group III-V compound semiconductor and a method of fabricating a semiconductor light emitting device.

BACKGROUND

Optical devices, such as laser diodes (LD) and light emitting diodes (LED) can be fabricated by crystal growth of a nitride-based group III-V compound semiconductor on a sapphire substrate, a SiC substrate, etc. As technical problems for optical devices of this type, there are improvements in heat dissipation performance and light extraction efficiency.

Recently, there has been proposed a technique in which a problem of heat dissipation performance can be solved and large current operation is feasible by bonding a nitride-based group III-V compound semiconductor to a substrate superior to a sapphire substrate or a SiC substrate in heat dissipation performance and peeling off the substrate by a laser lift-off method.

It is common to perform thermo compression bonding when a nitride-based group III-V compound semiconductor on a sapphire substrate is bonded to a substrate with excellent heat dissipation performance (see, U.S. Patent Application Publication No. US 2007/0298587.)

However, there is a case in which a sapphire substrate or a SiC substrate has already been bended before the bonding. Moreover, voids may be formed in the vicinity of the bonded surfaces or an adhesion force may be reduced due to the heat at the time of thermo compression bonding and the strength of a bonding force. Because of this, a problem such as cracking or peeing-off of a GaN thin film may occur during laser lift-off and cracking of a support substrate.

As a technique to form a support substrate, besides the bonding of the substrate described above, there is a technique to grow a thick metal film by plating in order to use the plated metal film as the substrate, which achieves reduction of the process steps and cost. Nevertheless, when a thick metal film is formed on the compound semiconductor described above by plating, a problem such as diffusion of the plated metal may occur. It is thus not easy to perform a process of combining the laser lift-off and plating.

BRIEF DESCRIPTION OF THE DRAWINGS

FIG. 1 is a sectional view of a semiconductor light emitting device according to an embodiment;

FIG. 4 is a plan view showing an example of isolation grooves 21; and

FIG. 5(a) is a view showing an example of laser scanning in parallel with the isolation grooves 21, and FIG. 5(b) is a view showing an example of laser scanning in orthogonal to the isolation grooves 21.

DETAILED DESCRIPTION

Figure 2:
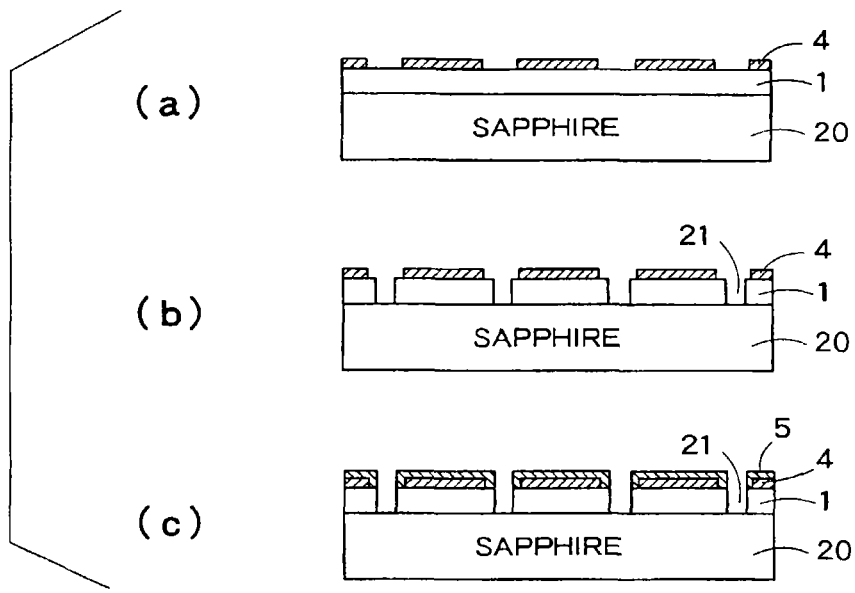
FIGS. 2A-2C are a process view showing an example of a fabrication process of the semiconductor light emitting device of FIG. 1.

According to one embodiment, a semiconductor light emitting device has a light emitting element, a first electrode layer, a second electrode layer, a seed electrode layer and a plated layer. The light emitting element has a nitride-based III-V compound semiconductor on a substrate, the light emitting element having a light extraction surface. The first electrode layer on the light extraction surface. The second electrode layer is provided on a surface opposite to the light extraction surface of the light emitting element. The seed electrode layer is configured to cover the entire surface of the second electrode layer. The plated layer is provided on the seed electrode layer. The light emitting element has a light emitting layer, a first conductive type semiconductor layer, and a second conductive type semiconductor layer. The first conductive type semiconductor layer is disposed between the light emitting layer and the first electrode layer. The second conductive type semiconductor layer is disposed between the light emitting layer and the second electrode layer. The light emitting element has a forward tapered shape of a width which gradually narrows in order of the second conductive type semiconductor layer, the light emitting layer and the first conductive type semiconductor layer.

Embodiments will now be explained with reference to the accompanying drawings.

FIG. 1 is a sectional view of a semiconductor light emitting device according to an embodiment. The semiconductor light emitting device of FIG. 1 has a nitride-based group III-V compound semiconductor layer (light emitting element) 1, an n-electrode layer (a first electrode layer) 3 formed on a light extraction surface 2 provided on one main surface side of the compound semiconductor layer 1, a p-electrode layer (a second electrode layer) 4 formed on a surface opposite to the light extraction surface 2 by sandwiching the compound semiconductor layer 1 therebetween, a seed electrode layer 5 formed so as to cover the entire surface of the p-electrode layer 4, a plated layer 6 formed on the seed electrode layer 5, and a ground electrode layer 7 formed on the plated layer 6.

Accordingly, the semiconductor light emitting device of FIG. 1 supports the nitride-based group III-V compound semiconductor layer 1 by using the plated layer 6 as a support substrate.

The compound semiconductor layer 1 has an n-type semiconductor layer (a first conductive-type semiconductor layer) 11, a light emitting layer 12, and a p-type semiconductor layer (a second conductive-type semiconductor layer) 13 in order downwardly from the light extraction surface 2. The three layers are formed into a forward tapered shape with the width which gradually broadens in order of the n-type semiconductor layer 11, the light emitting layer 12, and the p-type semiconductor layer 13.

Figure 3:
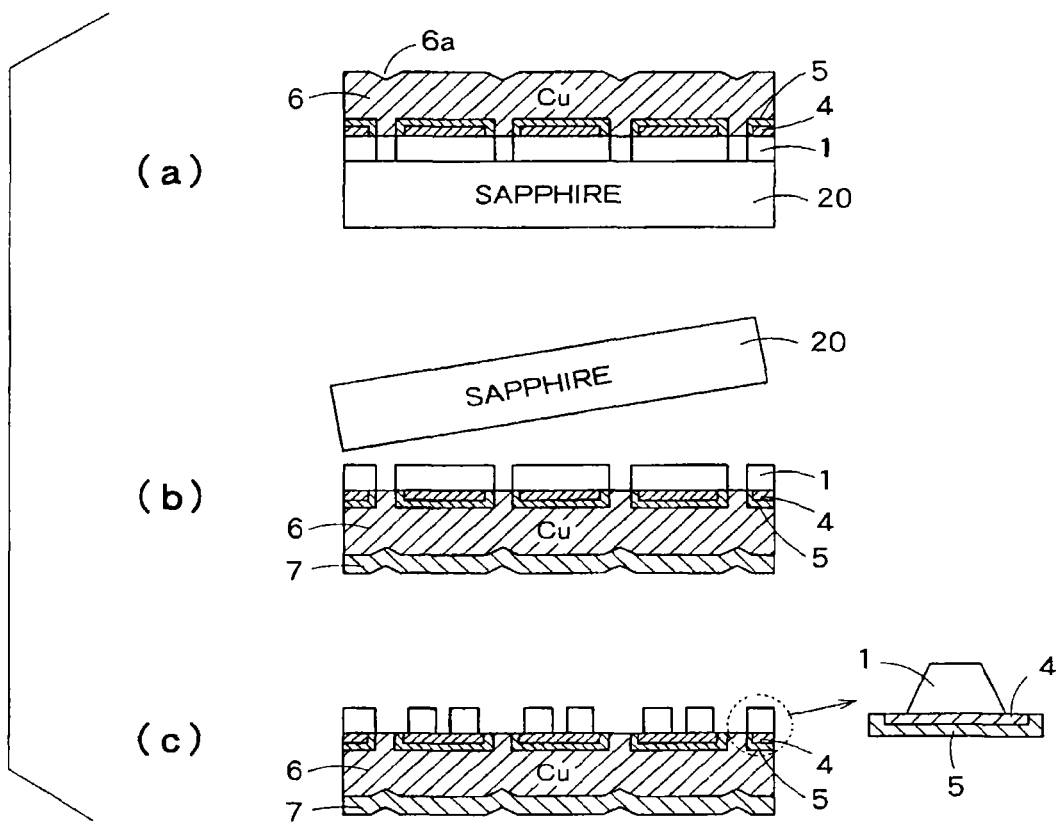
FIGS. 3A-3C are is a process view following to FIG. 2.

FIGS. 2 and 3 are process views that show an example of a fabrication process of a semiconductor light emitting device of FIG. 1. At first, the layers in the compound semiconductor layer 1 are laminated on a sapphire substrate 20. These layers are deposited in order by, for example, metal organic chemical vapor deposition (MOCVD). The material of the compound semiconductor layer 1 is preferably a GaN-based single crystal that can grow on the sapphire substrate 20 or a SiC substrate by crystal growth at high quality. A concrete example of the material is $Al_xGa_{1-x-y}In_yN$ ($0 \leq x \leq 1$, $0 \leq y \leq 1$).

A substrate for the compound semiconductor layer 1 to grow thereon by crystal growth is thus not limited to the sapphire substrate 20 but may be a SiC substrate, for example.

The laminated structure of the compound semiconductor layer 1 has a buffer layer, an n-type contact layer, the n-type semiconductor layer 11, the light emitting layer 12, and the p-type semiconductor layer 13 from the side closer to the sapphire substrate 20. The n-type contact layer and the buffer layer are omitted in FIGS. 1 and 2.

The n-type contact layer is a GaN-based semiconductor layer doped with a larger amount of n-type impurities than those of the n-type semiconductor layer 11 and the buffer layer. The buffer layer is formed by doping a GaN-based semiconductor layer with n-type impurities, such as silicon or germanium, in the impurity concentration from about $1 \times 10^{18}$ to $2 \times 10^{18}$ cm$^{-3}$. The growth temperature of the buffer layer is about 1000 to 1100° C.

The n-type semiconductor layer 11 is formed by doping a GaN-based semiconductor layer with impurities of Si. The impurity concentration of Si is about $5 \times 10^{18}$ cm$^{-3}$.

A structure used for the light emitting layer 12 is a SQW structure in which an InGaN-made quantum well layer having a film thickness of several nanometers and undoped-InGaN-made barrier layers each having a film thickness of several nanometers and provided on both sides of the quantum well layer are laminated in order. Or, it is a MQW structure in which quantum well layers and barrier layers are laminated to one another. The growth temperature is about 700 to 800° C.

The p-type semiconductor layer 13 is formed by doping a GaN-based semiconductor layer with p-type impurities, such as magnesium or zinc, in the impurity concentration from about $4 \times 10^{18}$ to $1 \times 10^{20}$ cm$^{-3}$. The p-type contact layer to be formed on top of the p-type semiconductor layer 13 is doped with p-type impurities, such as magnesium, in the impurity concentration about $1 \times 10^{19}$ cm$^{-3}$. The growth temperature is about 1000 to 1100° C.

When the compound semiconductor layer 1 has been formed on the sapphire substrate 20 as described above, next, as shown in FIG. 2(a), the p-electrode layer 4 is selectively formed on the compound semiconductor layer 1. The p-electrode layer 4 has a laminated structure of a p-type ohmic electrode layer 4a and a highly reflective electrode layer 4b. By thermally treating these layers, ohmic contact is obtained and also it is possible to lead light generated by the light emitting layer 12 in the direction of the light extraction surface 2 or to reflect the light at the side faces of the compound semiconductor layer 1.

The p-type ohmic electrode layer 4a is required to have a low contact resistance to the p-type semiconductor layer 13. A platinum group such as Pt, Ru, Os, Rh, Ir, Pd, etc. or Ag is preferable. Although use of Ag is preferable in view of refractive index, it is not so preferable in view of adhesive force and contact resistance to a p-semiconductor. It is thus preferable to use Ag as the material of the highly reflective electrode layer 4b and to use a material that enhances the adhesive force and uniformity with Ag as the p-type ohmic electrode layer 4a.

Next, as shown in FIG. 2(b), isolation grooves 21 are formed in a stripe pattern on the compound semiconductor layer 1 by dry etching at a depth reaching the sapphire substrate 20. FIG. 4 is a plan view of the isolation grooves 21. As shown, the isolation grooves 21 are formed at specific regular intervals in one direction on the wafer-like sapphire substrate 20. The reasons for providing the isolation grooves 21 are to prevent the plated layer 6 to be formed by electroplating in a later process and the compound semiconductor layer 1 from being electrically connected to each other and the tracks of edges of a laser beam used in the laser lift-off method from remaining on the compound semiconductor layer 1.

Next, as shown in FIG. 2(c), the seed electrode layer 5 is formed on the p-electrode layer 4. As shown in FIG. 1, the seed electrode layer 5 has a double-layer structure of a layer 5a formed so as to cover the entire surface of the p-electrode layer 4 and a layer 5b formed on the layer 5a. The layer 5a is provided to prevent the metal in the plated layer 6 that is formed in a later process from being diffused into the p-electrode layer 4. A single metal of Ti, Ni, etc. or an alloy of TiN, TiW, etc. is preferable. The layer 5a may not be a single-layer film but a multi-layer film.

The layer 5a is thicker than the highly reflective electrode layer 4b, and the former 5a is larger in surface area than that of the latter 4b. Thus, it can be totally avoided that the metal from the plated layer 6 is thermally diffused into the highly reflective electrode layer 4b. Therefore, the decrease in refractive index of the highly reflective electrode layer 4b can be restricted.

The layer 5b is Au, Cu, etc. that is preferably a material mingled with the metal of the plated layer 6. Thus, when the metal of the plated layer 6 is Cu or a Cu-based alloy, the layer 5b is preferably a Cu-sputtered film having a film thickness of 3000 angstrom or more.

Next, as shown in FIG. 3(a), the plated layer 6 is formed on the entire surface of the seed electrode layer 5 by electroplating. The plated layer 6 is a thick metal film of about 50 to 250 μm in film thickness. The thickness of the plated layer 6 is determined in accordance with the width of the insulating grooves 21 and the plating material. The plated layer 6 is also formed inside the insulating grooves 21. However, as the width of the insulating grooves 21 becomes wider, the height of the plated layer 6 becomes lower in the insulating grooves 21. As the height of the plated layer 6 becomes lower in the insulating grooves 21, a concave portion 6a formed on the opposite surface of the plated layer 6 becomes deeper. Accordingly, the width of the insulating grooves 21 is preferably about 5 to 40 μm. When the film thickness of the plated layer 6 is set to about 10 times of the width of the insulating grooves 21, no matter what material is used as the base material of the plated layer 6, a sufficient mechanical strength is obtained as a support substrate.

Since Cu exhibits a high thermal conductivity, Cu is suitable for being used as a support of a semiconductor light emitting device conducted through the electrodes provided in the vertical direction. By forming the plated layer 6 with Cu as a base material, heat dissipation performance is enhanced compared to the sapphire substrate 20, thus lowering the operating temperature of the light emitting layer 12. Therefore, steep current versus optical output characteristics can be obtained and thermal saturation hardly occurs. As a result, it is possible to exhibit quality of the compound semiconductor 1 to the maximum.

It is well known that, when Cu or a Cu-based alloy is used for the plated layer 6, metal migration occurs in the plated layer 6 to lower the quality even after the fabrication of a semiconductor light emitting device. Thus, some measure must be taken. For this reason, it is required to provide the ground electrode layer 7 on the surface of the plated layer 6. The ground electrode layer 7 has a laminated structure of a barrier metal 7a and a ground electrode 7b. The material of the barrier metal 7a is preferably Ti, Ni, etc., as discussed above. The material of the ground electrode 7b is preferably Au. Another electrode layer may be formed on the ground electrode 7b. The material in this case is preferably Ni/Au, Ti/Pt/Au, etc.

Next, as shown in FIG. 3(b), the sapphire substrate 20 is peeled off by the laser lift-off method. Here, as shown in FIG. 4, a laser beam is emitted to the sapphire substrate 20 from the rear side while the laser is positioned so that the edges of a laser beam overlap with the isolation grooves 21. The laser is preferably a KrF laser of about 248 nm in wavelength and about 0.6 to 0.8 J/cm$^2$ in laser power density. There are two directions feasible for laser scanning.

FIG. 5(a) shows an example of scanning laser in parallel with the isolation grooves 21. FIG. 5(b) shows an example of scanning laser in orthogonal to the isolation grooves 21. In FIG. 5, a laser spot 22 is indicated in a rectangular shape. As shown, in this embodiment, the pitch of the isolation grooves 21 (the gap between adjoining isolation grooves 21) roughly matches the width of the laser spot 22. This results in that the edges of a laser beam always overlap the isolation grooves 21.

When the sapphire substrate 20 is peeled off by the laser lift-off method, there is a problem in that the tracks of laser beam edges remain on the compound semiconductor layer 1 to cause damages. The reason why such tracks remain is considered as due to the pressure of a nitrogen gas generated by laser emission. Thus, if a nitrogen gas generated by laser emission can be released quickly, its pressure is lowered, and hence there are no remaining tracks of laser beam edges.

In the case of FIG. 5(a), since laser scanning is performed along the isolation grooves 21, a nitrogen gas can be released through the isolation grooves 21. In detail, the nitrogen gas can be released through the isolation grooves 21 at the two sides of the laser spot 22 that overlap the isolation grooves 21, among the four sides of the spot 22. There is thus no concern that the tracks of laser beam edges remain at the two sides.

Moreover, when laser scanning is performed in the direction of an arrow in FIG. 5(a), since the sapphire substrate 20 is peeled off quickly by laser emission at the upper side of the laser spot 22, the nitrogen gas is also released from this upper side. Thus, there is no concern that the tracks of laser beam edges remain at the upper side of the laser spot 22.

Accordingly, there is a concern that the tracks of laser beam edges remain at only the lower side of the laser spot 22. However, since most of the nitrogen gas is released along the three sides described above and hence the pressure of the nitrogen gas is lowered sufficiently. Thus, there is less concern that the tracks of laser beam edges remain at the lower side of the laser spot 22.

Also, as shown in FIG. 5(b), in the case where laser is scanned in orthogonal to the isolation grooves 21, laser is emitted after a laser beam is shifted so that laser beam edges overlap with the isolation grooves 21. Thus, like shown in FIG. 5(a), a nitrogen gas generated by laser emission can be released through the isolation grooves 21. There is thus less concern that the tracks of laser beam edges remain on the compound semiconductor.

After the sapphire substrate 20 is peeled off by the laser lift-off method, as shown in FIG. 3(c), dry etching is performed to the compound semiconductor layer 1 to form a plurality of light emitting devices. At this time, the layer damaged by the laser lift-off is also removed.

The sidewalls of each light emitting device obtained by dry etching are formed into a forward tapered shape. Moreover, an n-type contact layer is exposed to the surface of the compound semiconductor layer 1. The n-type contact layer has the largest doping amount of n-type impurities in the n-type semiconductor layer 11.

After the entire surface of the n-type contact layer is covered with an insulating layer, an insulating layer 23 is formed only on the sidewall portions of the compound semiconductor layer 1 that corresponds to a light emitting device, by etching using a photoresist. The material of the insulating layer 23 is, for example, SiO$_2$ or SiN. The insulating layer 23 is also formed on the p-electrode layer 4 and the seed electrode layer 5. By forming the insulating layer 23, short circuits can be prevented, due to the attachment of alien substances in the subsequent processes (such as, a rough surfacing process to the light extraction surface 2 and a dicing process for dicing into individual light emitting devices).

The light emitting device of this embodiment has a forward tapered shape, and has a structure in which the insulating layer 23 is easily attached. Thus, the insulating layer 23 can be formed at the sidewalls of the light emitting device with no particular process modifications.

Next, the rough surfacing process is performed in which the upper surface of the compound semiconductor layer 1, that is, the light extraction surface 2 provided on the upper surface side of the n-type semiconductor layer 11 is processed to make the rough surface. In the rough surfacing process, the light extraction surface 2 is roughly etched by wet etching with an alkaline solution or dry etching over the enter surface or a portion of the surface 2, except for the portion on which the n-electrode layer 3 is to be formed in the subsequent process. The rough surfacing process is a treatment for enhancing light extraction efficiency.

Next, the n-electrode layer 3 is formed on a portion of the light extraction surface 2. The n-electrode layer 3 has a laminated structure of a Ti layer 7a that is in contact with the light extraction surface 2 of the n-type semiconductor layer 11, an Al layer 3b formed on the Ti layer 3a, and an Au layer 3c formed on the Al layer 3b. The n-electrode layer 3 is not limited to a 3-layer structure but may be a 4-layer structure of Ti/Al/Ni/Au or a 5-layer structure of Ti/Al/Ta/Pt/Au.

As described above, in this embodiment, after the isolation grooves 21 are formed in a stripe pattern on the compound semiconductor layer 1 formed on the sapphire substrate 20, the plated layer 6 is formed on the entire surface of the compound semiconductor layer 1. The plated layer 6 can thus be used as a support substrate after the sapphire substrate is peeled off. Therefore, there is no need to bond a particular support substrate to the compound semiconductor layer 1 by thermo compression bonding. For this reason, there is no problem in that the support substrate bends due to the effect of heat at thermo compression bonding, that is, the thermal stress, which results in cracking of the support substrate in the laser lift-off process. Moreover, since the plated layer 6 can be formed by electroplating, the number of fabrication processes is fewer than thermo compression bonding and the fabrication cost can be reduced. Furthermore, the plating temperature in the electroplating process is lower than the temperature in the thermo compression bonding. It is thus expected to mitigate the deterioration of the electrical characteristics, optical characteristics, etc. due to metal diffusion.

Moreover, in this embodiment, the seed electrode layer 5 is formed so as to cover the surface of the p-electrode layer 4 in order to prevent the metal (such as Cu) in the plated layer 6 from being thermally diffused into the p-electrode layer 4. Thus, there is no concern in that the metal in the plated layer 6 is thermally diffused into the p-electrode layer 4. Therefore, it is achieved to control the decrease in refractive index of the highly reflective electrode layer 4*b*.

Furthermore, in this embodiment, the isolation grooves 21 are formed at specific regular intervals in one direction on the sapphire substrate 20, at the pitch of the isolation grooves 21 roughly matching the width of the laser spot 22, and laser scanning is performed along the isolation grooves 21 so that laser beam edges overlap the isolation grooves 21. There is thus no concern that the tracks of the beam edges remain on the compound semiconductor layer 1. Moreover, since a nitrogen gas generated by laser emission is released through the isolation grooves 21, the pressure of the nitrogen gas can be lowered. This further prevents occurrence of the tracks of the laser beam edges.

Still, furthermore, in this embodiment, after peeling off the sapphire substrate 20 by the laser lift-off method, dry etching is performed to the surface of the compound semiconductor layer 1 to form a plurality of light emitting devices. Thus, the sidewalls of each light emitting device can be formed into a forward tapered shape. Therefore, it is easy to form the insulating layer 23 on the sidewall portions of the light emitting device in the subsequent process. The sidewalls of the light emitting device can thus be protected with a simple process.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor light emitting device, comprising:
   a light emitting element comprising a first conductive type semiconductor layer, a second conductive type semiconductor layer and a light emitting layer disposed between the first conductive type semiconductor layer and the second conductive type semiconductor layer;
   a first electrode layer connected to the first conductive type semiconductor layer;
   a second electrode layer disposed under the second conductive type semiconductor layer so that all of one surface of the second electrode layer contacts the second conductive type semiconductor layer;
   a first metal layer configured to cover a bottom surface and a side surface of the second electrode layer, the first metal layer having a step in accordance with an outline of the second electrode layer; and
   a second metal layer disposed under the first metal layer, the second metal layer having a step in accordance with a shape of the first metal layer in a surface opposite to a surface contacting the first metal layer,
   wherein the light emitting element has a forward tapered shape of a width which gradually narrows in order of the second conductive type semiconductor layer, the light emitting layer and the first conductive type semiconductor layer.

2. The device according to claim 1,
   wherein the first metal layer comprises:
   a first layer which covers the bottom surface and the side surface of the second electrode layer and includes a metal material capable of preventing a metal in the second metal layer from being diffused in the second electrode layer; and
   a second layer which contacts the first layer and the second metal layer and mingles with the metal in the second metal layer.

3. The device according to claim 2,
   wherein the second electrode layer comprises a highly reflective electrode layer which contacts the first layer and reflects light emitted by the light emitting layer;
   the first layer has a surface area larger than a surface area of the highly reflective electrode layer; and
   the first layer has a thickness larger than a thickness of the highly reflective electrode layer.

4. The device according to claim 1, further comprising:
   a ground electrode layer having a structure of laminating a barrier metal layer and a ground electrode.

5. The device according to claim 1, further comprising:
   an insulating film configured to cover a sidewall of the forward tapered shape of the light emitting element.

* * * * *